United States Patent
Lee

(10) Patent No.: US 6,613,492 B2
(45) Date of Patent: Sep. 2, 2003

(54) PHOTOSENSITIVE POLYMER HAVING PHENYL RING AND LACTONE GROUP AND RESIST COMPOSITION COMPRISING THE SAME

(75) Inventor: Si-hyeung Lee, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 161 days.

(21) Appl. No.: 09/933,042

(22) Filed: Aug. 21, 2001

(65) Prior Publication Data

US 2002/0090568 A1 Jul. 11, 2002

(30) Foreign Application Priority Data

Dec. 20, 2000 (KR) ........................................ 2000-79190

(51) Int. Cl.[7] ............................................. G03C 7/038
(52) U.S. Cl. ................................................... 430/270.1
(58) Field of Search ...................................... 430/270.1

(56) References Cited

U.S. PATENT DOCUMENTS 6,503,687 B2 * 1/2003 Kim et al. ................ 430/270.1

FOREIGN PATENT DOCUMENTS

| EP | 420232 | * | 9/1990 | ......... C07H/17/075 |
| JP | 63-113451 | * | 5/1988 | ............. G03C/1/72 |

OTHER PUBLICATIONS

English language abstract of JP 63-113451.*

* cited by examiner

Primary Examiner—Janet Baxter
Assistant Examiner—Amanda C. Walke
(74) Attorney, Agent, or Firm—Lee & Sterba, P.C.

(57) ABSTRACT

A photosensitive polymer having a phenyl ring and a lactone group, and a resist composition, wherein the resist composition contains a photosensitive polymer including a monomer unit having at least one group selected from the groups indicated by the following formulas, and a photoacid generator (PAG).

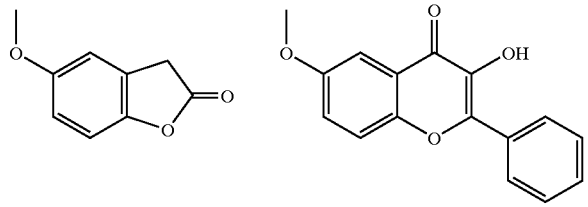

22 Claims, No Drawings

PHOTOSENSITIVE POLYMER HAVING PHENYL RING AND LACTONE GROUP AND RESIST COMPOSITION COMPRISING THE SAME

BACKGROUND OF THE INVENTION

1. Field of the Invention

The present invention relates to a chemically amplified resist composition, and more particularly, to a photosensitive polymer having a phenyl ring and a lactone group, and a resist composition comprising the same.

2. Description of the Related Art

As processes for manufacturing semiconductor devices become more complicated and the integration density of semiconductor devices increases, the need to form finer patterns becomes more pronounced. Furthermore, with regard to semiconductor memory devices having a capacity of 1 Gigabit or more, a pattern size having a design rule of 0.2 μm or less is needed. Accordingly, there are limitations in forming such fine patterns using conventional photoresist materials using a KrF excimer laser (248 nm). For this reason, a lithography technique using a new exposure light source, the ArF excimer laser (193 nm), has emerged.

However, a resist material suitable for use in lithography with the ArF excimer laser causes many problems in practical use, compared with a conventional resist material. The most serious problem is the collapse of patterns as the aspect ratio increases. Therefore, the thickness of the resist layer must be lowered. However, there is a limitation in the resistance of the resist layer to dry etching, so that many problems arise in actually forming patterns.

In order to increase resistance to dry etching, polymers introducing a phenyl group or an adamantly group have been suggested. However, these polymers have poor hydrophilic properties, and thus adhesive properties are not good. As a result, many problems can occur in a process using a resist layer such as lifting.

SUMMARY OF THE INVENTION

It is a first feature of the present invention to provide a photosensitive polymer having a structure capable of providing superior lithography performance when the photosensitive polymer is used for a resist material.

It is a second feature of the present invention to provide a resist composition capable of intensifying resistance to dry etching, and improving adhesive properties.

In accordance with one aspect of the present invention, there is provided a photosensitive polymer including a monomer unit having a group indicated by the following formula (I).

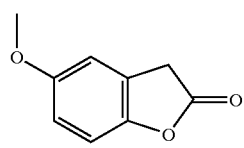

(I)

In more specific embodiments, the photosensitive polymer has the following structural formula:

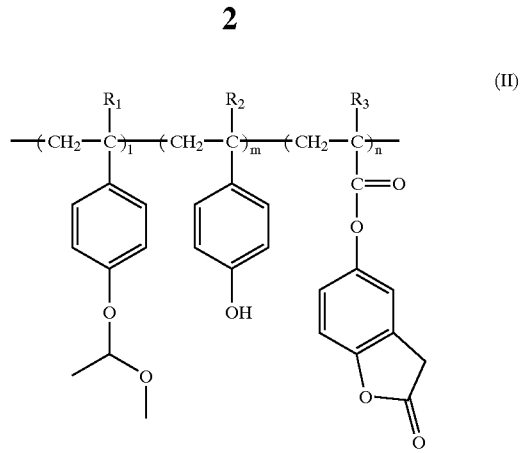

(II)

where $R_1$, $R_2$, and $R_3$ are independently a hydrogen atom or an alkyl group, $l/(l+m+n)$=about 0.2–0.5, $m/(l+m+n)$=about 0–0.5, and $n/(l+m+n)$=about 0.4–0.7.

In accordance with another aspect of the present invention, there is provided a monomer unit having a group indicated by the following formula (III):

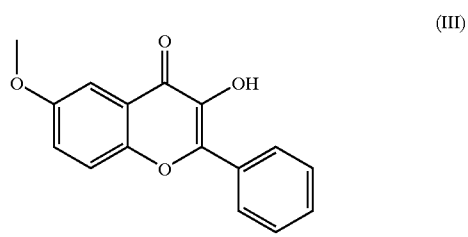

(III)

In more specific embodiments, the photosensitive polymer has the following structural formula (IV):

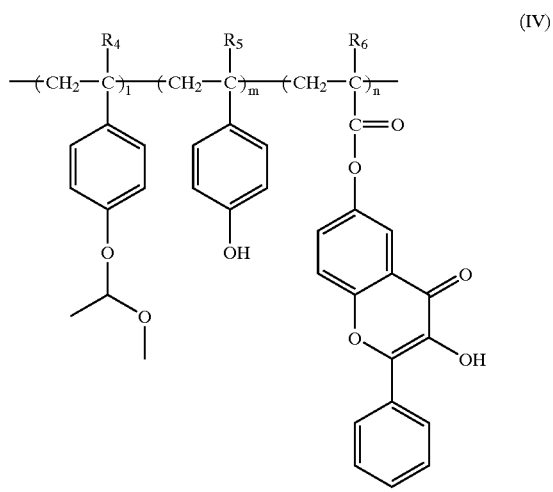

(IV)

where $R_4$, $R_5$, and $R_6$ are independently a hydrogen atom or an alkyl group, $l/(l+m+n)$=about 0.2–0.5, $m/(l+m+n)$=about 0–0.5, and $n/(l+m+n)$=about 0.4–0.7.

According to a further aspect of the present invention, there is provided a resist composition comprising (a) a photosensitive polymer including a monomer unit having a group indicated by the formula (I) above, and (b) a photoacid generator (PAG).

According to still another aspect of the present invention, there is provided a resist composition that comprises (a) a photosensitive polymer including a monomer unit having a group indicated by the formula (III) above, and (b) a PAG.

Other features and advantages of the present invention will become apparent to those skilled in the art from the following detailed description. It is to be understood, however, that the detailed description and specific examples, while indicating preferred embodiments of the present invention, are given by way of illustration and not limitation. Many changes and modifications may be made without departing from the spirit thereof, and the invention includes all such modifications.

DETAILED DESCRIPTION OF THE INVENTION

Priority Korean Patent Application No. 00-79190, filed Dec. 20, 2000, is hereby incorporated in its entirety by reference.

In particular embodiments, the substituents are $R_1$–$R_6$ can be alkyl groups having 1 to 6 carbon atoms.

The weight average molecular weight of the photosensitive polymer included in the resist composition according to the present invention preferably is about 1,000 to about 100,000.

The amount of the PAG preferably is in the range of about 1 to about 15% by weight based on the weight of the photosensitive polymer. Preferably, the PAG comprises at least one selected from the group consisting of triarylsulfonium salts, diaryliodonium salts, sulfonates, and mixtures thereof. More particularly, the PAG comprises triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxysuccinimide triflate, norbornene dicarboximide triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene dicarboximide nonaflate, triphenylsulfonium perfluorooctanesulfonate (PFOS), diphenyliodonium PFOS, methoxydiphenyliodonium PFOS, di-t-butyldiphenyliodonium PFOS, N-hydroxysuccinimide PFOS, norbornene dicarboximide PFOS, or a mixture of these materials.

The resist composition of the present invention can further comprise an organic base. The amount of the organic base preferably is in the range of about 0.01 to about 2.0% by weight based on the weight of the photosensitive polymer. Preferably, the organic base comprises a tertiary amine compound or a mixture of at least two tertiary amine compounds. More particularly, the organic base comprises triethylamine, triisobutylamine, triisooctylamine, triisodecylamine, diethanolamine, triethanolamine or a mixture of these compounds.

The photosensitive polymer according to the present invention includes a material having a phenyl ring and a lactone group. Therefore, the resist composition comprising such a photosensitive polymer not only provides sufficient resistance to dry etching but also has excellent adhesive properties.

The features and advantages of the present invention will become more apparent by describing in detail preferred embodiments thereof.

EXAMPLE 1

Synthesis of 2,5-dihydroxyphenylacetic-γ-lactonyl acrylate (DHPALA)

150.13 g 2,5-dihydroxyphenylacetic-γ-lactone (1 mol) and 150 g triethylamine (TEA) (1.5 mol) were dissolved in 500 g dried methylene chloride (MC). About 157 g of acryloyl chloride (1.5 mol) was slowly added to the solution using a dropping funnel. Here heat was generated, and so the solution was cooled using an ice bath. After the addition was completed, the obtained solution was slowly heated to room temperature, and strongly stirred for 10 hours. Produced salts were filtered out, and the remaining solution was extracted using ether. Under low pressure, a solvent, ether, was completely removed, and confirmed using gas chromatography. Then, the product was separated using column chromatography (80% yield).

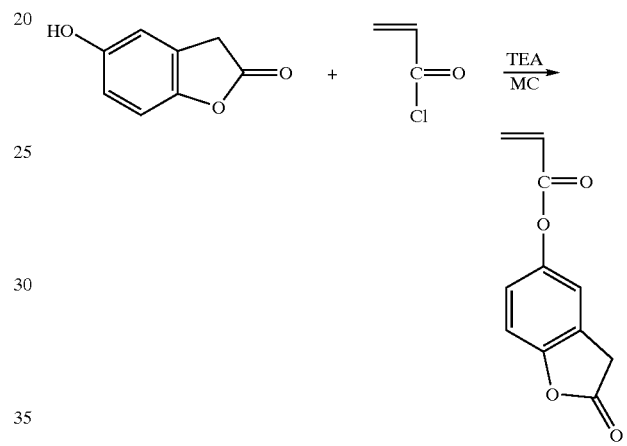

EXAMPLE 2

Synthesis of 2,5-dihydroxyphenylacetic-γ-lactonyl methacrylate (DHPALMA)

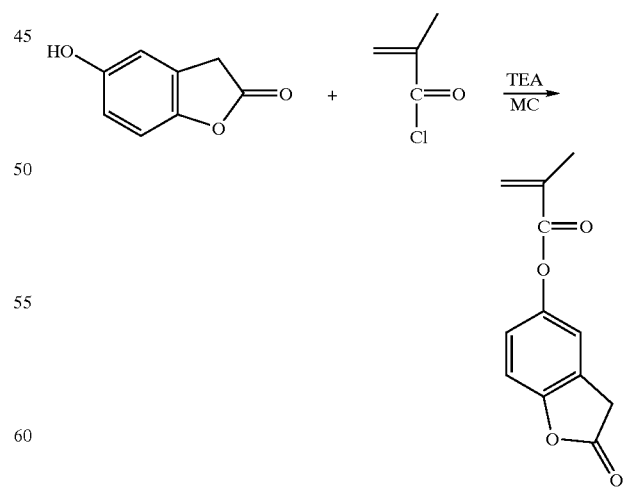

The desired product was obtained by the same method as Example 1 using methacryloyl chloride instead of acryloyl chloride (75% yield).

EXAMPLE 3

Synthesis of 3,6-dihydroxyflavonyl acrylate (DHFA)

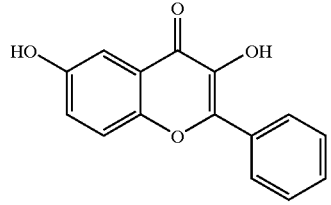 +  →(TEA/MC)→

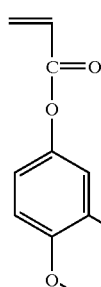

254 g 3,6-dihydroxyflavone (1 mol) and 150 g TEA (1.5 mol) were dissolved in 1000 g dried MC. About 157 g acryloyl chloride (1.5 mol) was slowly added to the solution using a dropping funnel. Here heat was generated, and so the solution was cooled using an ice bath. After the addition was completed, the obtained solution was heated to room temperature, and strongly stirred for 10 hours. Produced salts were filtered out, and the remaining solution was extracted using ether. Under low pressure, a solvent, ether, was completely removed, and confirmed using gas chromatography. Then, the product was separated using column chromatography (52% yield).

EXAMPLE 4

Synthesis of 3,6-dihydroxyflavonyl methacrylate (DHFMA)

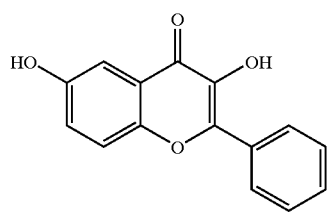 + 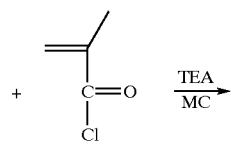 →(TEA/MC)→

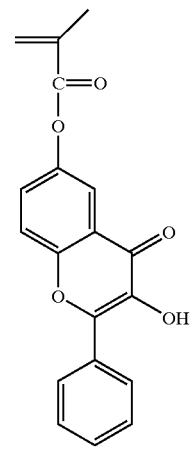

The desired product was obtained by the same method as Example 3 using methacryloyl chloride instead of acryloyl chloride (50% yield).

EXAMPLE 5

Synthesis of Copolymer

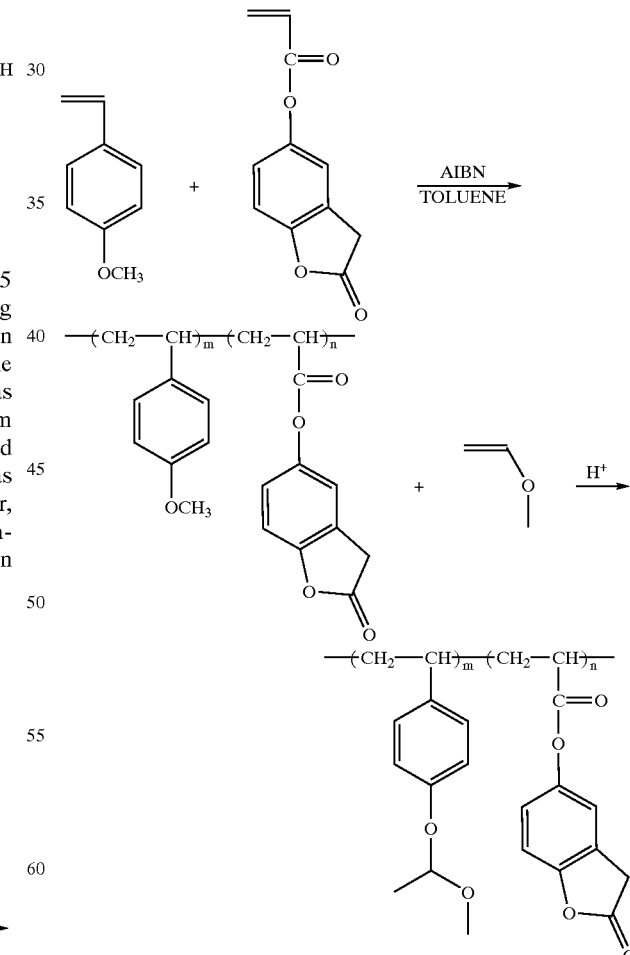

1.34 g of acetoxystyrene (0.07 mol) and 0.03 mol of DHPALA synthesized in Example 1 were dissolved in 30 g of dried toluene. 1.64 g of azobisisobutyronitrile (AIBN) was added to the solution, and purging was performed with $N_2$ for 4 hours. The solution was frozen with liquid nitrogen, made vacuous using a vacuum pump, and melted. This process was repeated three times, and air was completely removed from the reactant. The reactant was polymerized at 60° C. for 24 hours.

After polymerization, the polymerized product was precipitated with n-hexane, filtered, dissolved in tetrahydrofuran (THF), and precipitated again with n-hexane. This process was repeated three times, and the precipitate so obtained was dissolved in MC. A small amount of acid and methoxy ethyl ether were added to the solution and reacted for 24 hours. After the reaction was complete, the solution so obtained was precipitated in a solvent having a ratio of n-hexane:isopropyl alcohol of 3:1, and the desired product was obtained (70% yield).

EXAMPLE 6

Synthesis of Copolymer

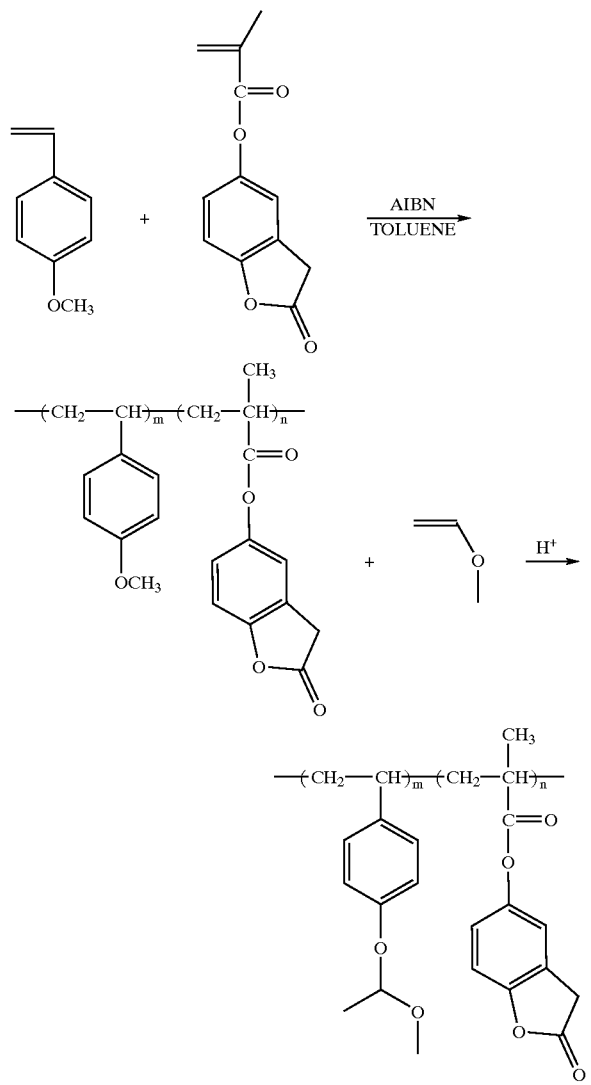

The desired product was synthesized by the same method as Example 5 using DHPALMA synthesized in Example 2 instead of DHPALA (65% yield).

EXAMPLE 7

Synthesis of Copolymer

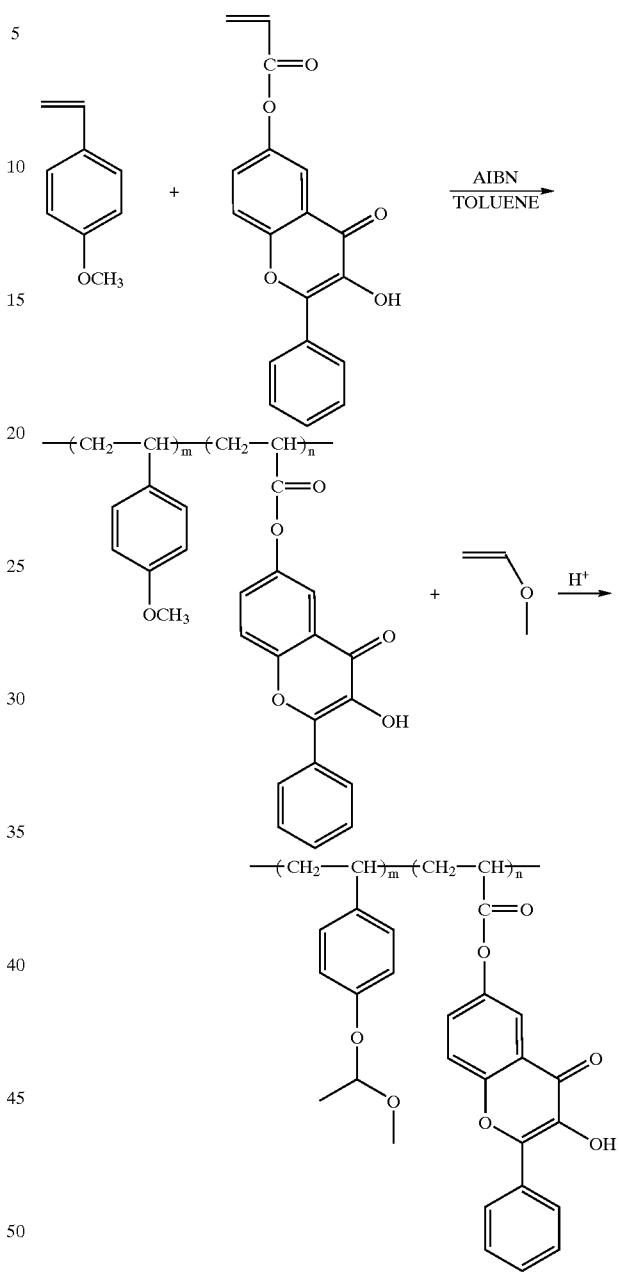

1.34 g of acetoxystyrene (0.07 mol) and 0.03 mol of DHFA synthesized in Example 3 were dissolved in 30 g of dried toluene. 1.64 g AIBN was added to the solution, and purging was performed with $N_2$ for 4 hours. The obtained solution was frozen with liquid nitrogen, made vacuous using a vacuum pump, and melted again. This process was repeated three times, and air was completely removed from the reactant. The reactant was polymerized at 60° C. for 24 hours.

After polymerization, a polymerized product was precipitated with n-hexane, filtered, dissolved in THF, and precipitated again with n-hexane. This process was repeated three times, and the precipitate so obtained was dissolved in MC. A small amount of acid and methoxy ethyl ether were added to the solution and reacted for 24 hours. After the reaction was complete, the solution so obtained was precipitated in a solvent having a ratio of n-hexane:isopropyl alcohol of 3:1, and the desired product was obtained (63% yield).

EXAMPLE 8

Synthesis of Copolymer

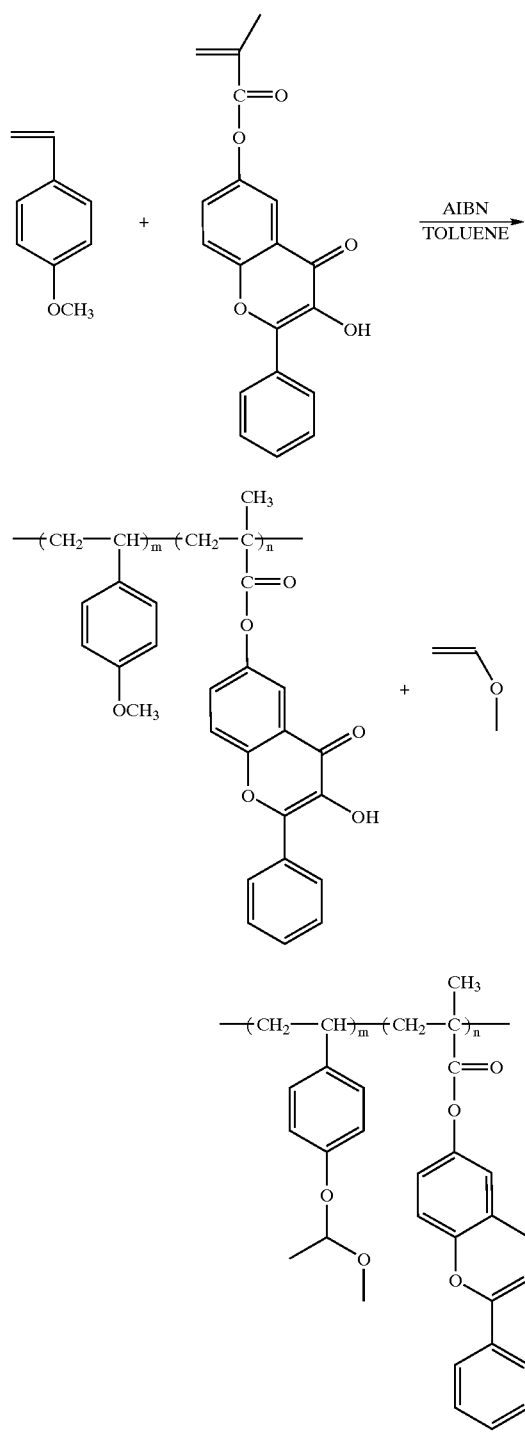

The desired product was synthesized by the same method as Example 7 using DHFMA synthesized in Example 4 instead of DHFA (61% yield).

EXAMPLE 9

Synthesis of Terpolymer

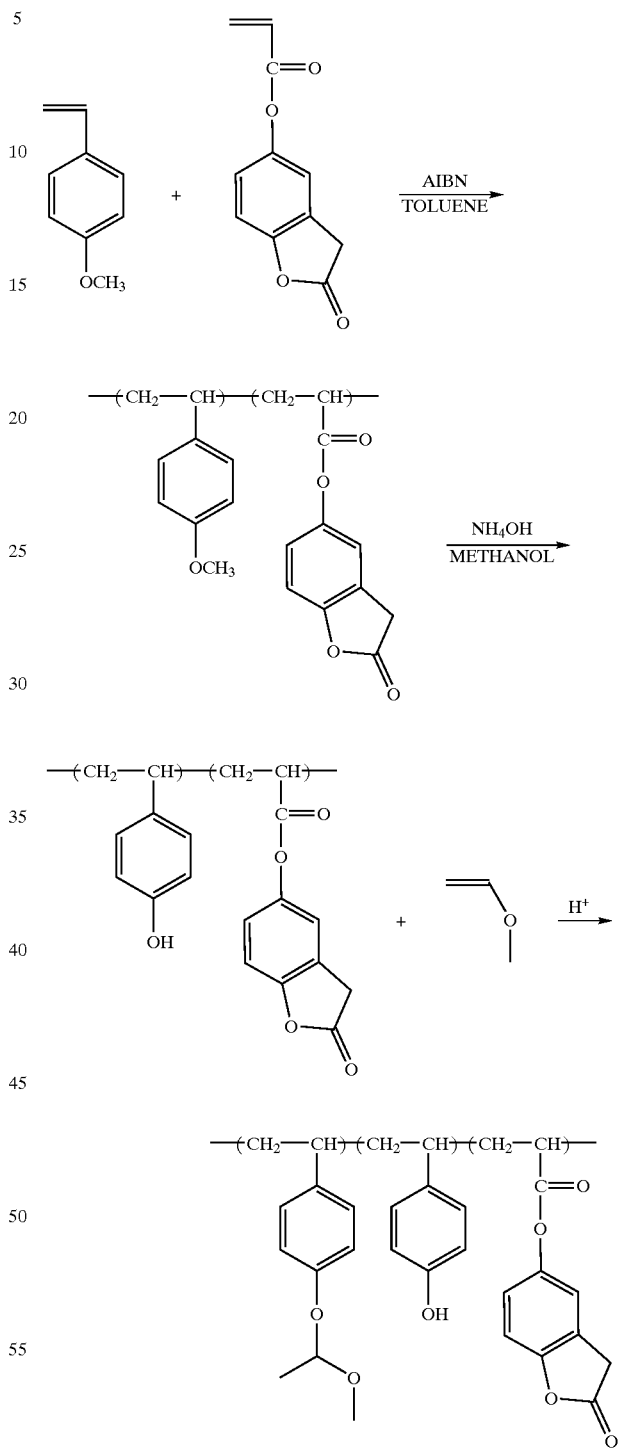

1.34 g of acetoxystyrene (0.07 mol) and 0.03 mol of DHPALA synthesized in Example 1 were dissolved in 30 g of dried toluene. 1.64 g of AIBN was added to the solution, and purging was performed with $N_2$ for 4 hours. The solution was frozen with liquid nitrogen, made vacuous using a vacuum pump, and melted. This process was repeated three times, and air was completely removed from the reactant. The reactant was polymerized at 60° C. for 24 hours.

After polymerization, a polymerized product was precipitated with excess n-hexane, filtered, dissolved in THF, and precipitated using n-hexane. This process was repeated three times, and the precipitate so obtained was dissolved in methanol. A small amount of ammonia water solution was added to the solution, and reacted for 24 hours. After the reaction was complete, the reaction result was precipitated with deionized water, and filtered. This process was repeated three times, and the precipitates so obtained were dissolved in MC. A small amount of acid and methoxy ethyl ether were added to the solution, and reacted for 24 hours. After the reaction was complete, the solution so obtained was precipitated with a solvent having a ratio of n-hexane:isopropyl alcohol of 3:1, and the desired product was obtained (70% yield).

EXAMPLE 10

Synthesis of Terpolymer

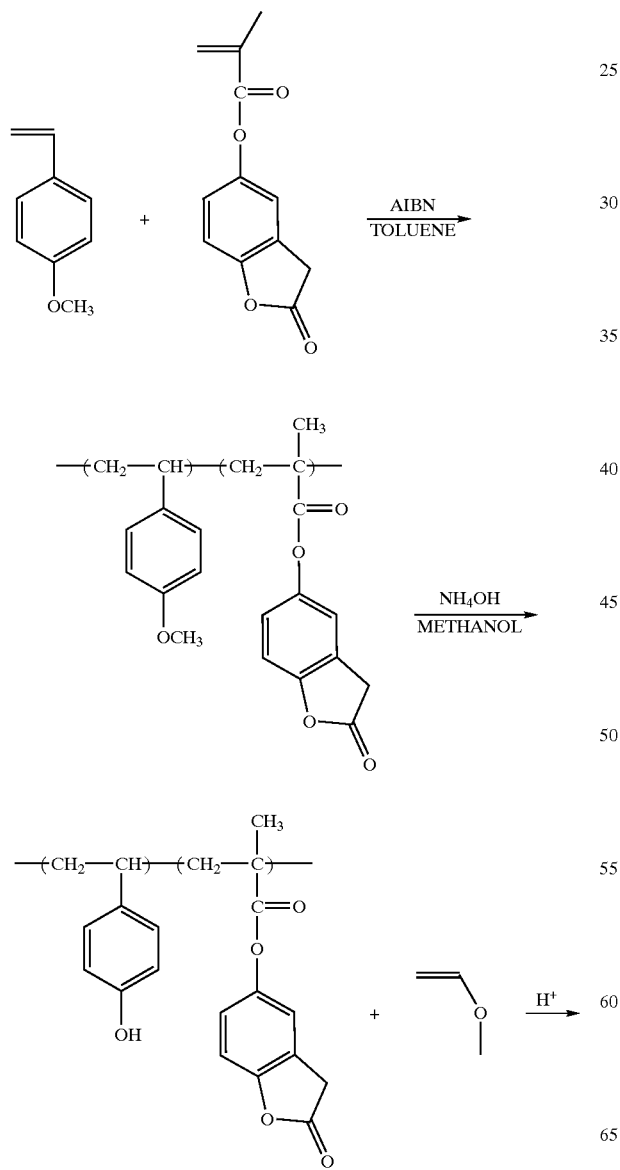

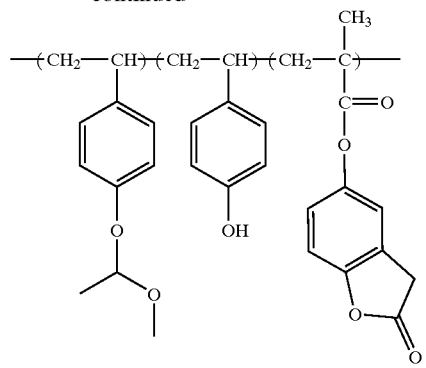

The desired product was synthesized by the same method as Example 9 using DHPALMA synthesized in Example 2 instead of DHPALA (75% yield).

EXAMPLE 11

Synthesis of Terpolymer

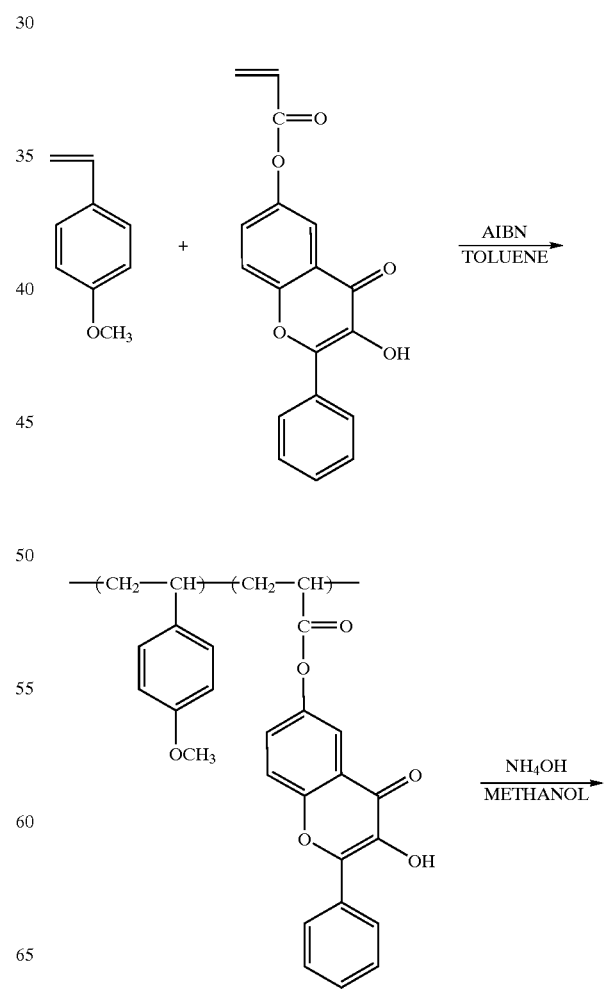

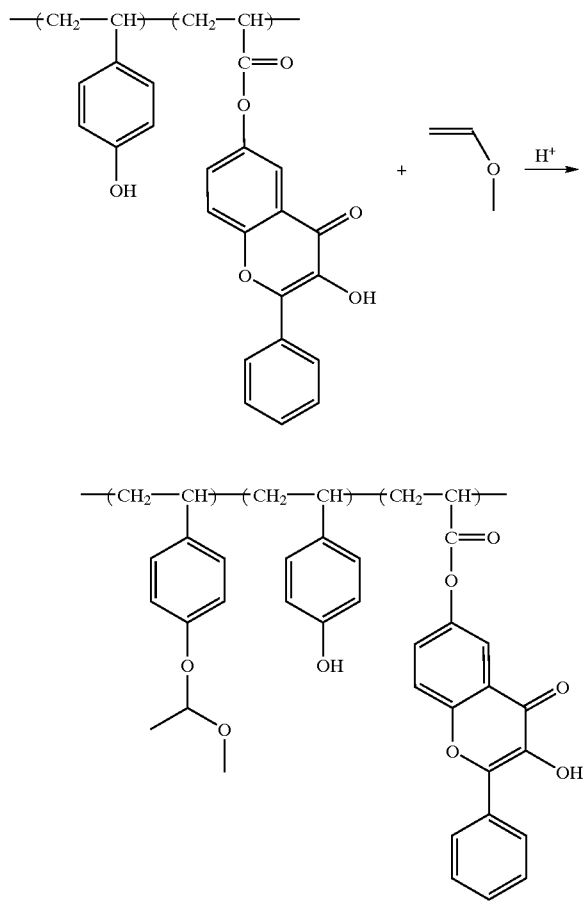

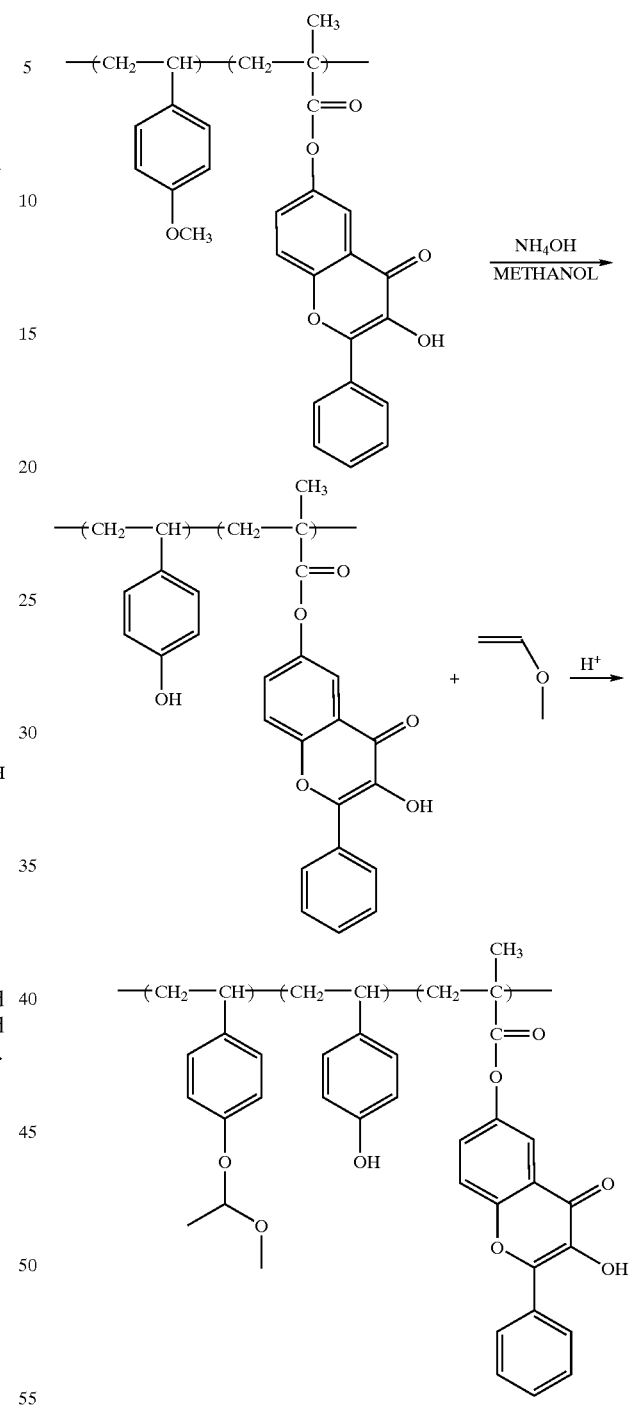

The desired product was synthesized by the same method as Example 9 using 1.34 g of acetoxystyrene (0.07 mol) and 0.03 mol of DHFA synthesized in Example 3 (70% yield).

EXAMPLE 12

Synthesis of Terpolymer

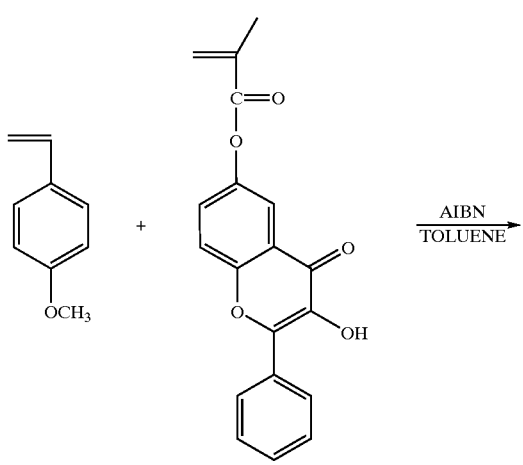

The desired product was synthesized by the same method as Example 11 using DHFMA synthesized in Example 4 instead of DHFA (75% yield).

EXAMPLE 13

Synthesis of Resist Composition

Polymers (1.0 g) synthesized in Examples 5 through 12 were dissolved in a propylene glycol monomethyl ether acetate (PGMEA) solvent, respectively. A PAG, triphenylsulfonium triflate, was added to the solution, filtered using a 0.2 μm membrane filter, and a resist composition was obtained. The resist composition so obtained was coated at 2500 rpm on a 6 inch wafer, and a resist layer was formed to a thickness of about 0.3 μm.

The wafer having the resist layer was soft baked at 110EC for 90 seconds, exposed using a KrF excimer laser (NA= 0.6), and subjected to a post-exposure bake (PEB) process at 100EC for 90 seconds.

The resultant wafer was developed using a tetramethylammonium hydroxide of 2.38% by weight for about 60 seconds, and a resist pattern was formed.

As a result, a 180 nm line and space pattern (1:1) was obtained.

A photosensitive polymer according to the present invention comprises a material having a phenyl ring capable of intensifying resistance to dry etching and a lactone group capable of improving the adhesive properties and exhibiting hydrophilic properties. Therefore, a resist composition formed of such a photosensitive polymer not only provides sufficient resistance to dry etching but also has excellent adhesive properties. Thus, use of a resist composition according to the present invention in a lithography process exhibits superior lithography performance, so that it can be very useful in the manufacture of future generation semiconductor devices.

While this invention has been particularly shown and described with reference to preferred embodiments thereof, it will be understood by those skilled in the art that various changes in form and details may be made thereto without departing from the spirit and scope of the invention as defined by the appended claims.

What is claimed is:

1. A photosensitive polymer comprising a monomer unit having a group indicated by the following formula (I):

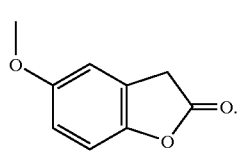

(I)

2. The photosensitive polymer of claim 1 having the following formula (II):

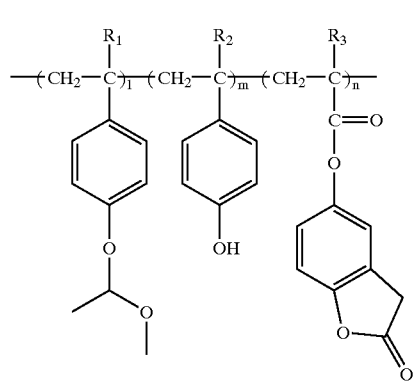

(II)

where $R_1$, $R_2$, and $R_3$ are independently a hydrogen atom or an alkyl group, $l/(l+m+n)$=about 0.2–0.5, $m/(l+m+n)$=about 0–0.5, and $n/(l+m+n)$=about 0.4–0.7.

3. A photosensitive polymer comprising a monomer unit having a group indicated by the following formula (III):

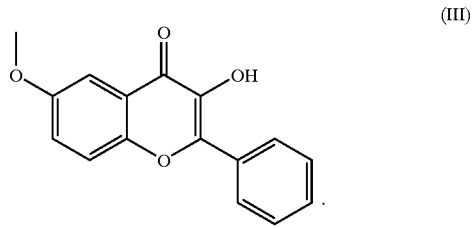

(III)

4. The photosensitive polymer of claim 3 having the following formula (IV):

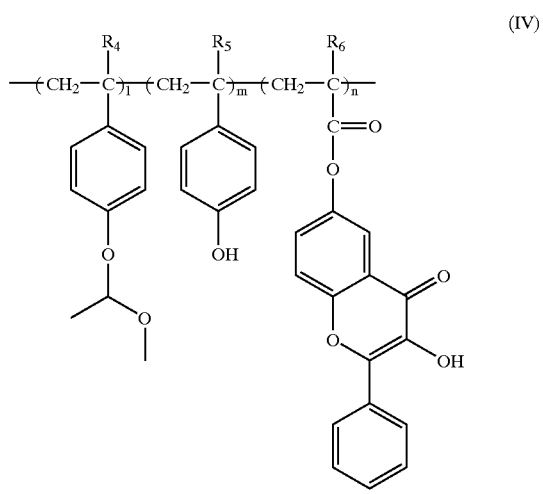

(IV)

where $R_4$, $R_5$, and $R_6$ are independently a hydrogen atom or an alkyl group, $l/(l+m+n)$=about 0.2–0.5, $m/(l+m+n)$=about 0–0.5, and $n/(l+m+n)$=about 0.4–0.7.

5. A resist composition comprising:

(a) a photosensitive polymer including a monomer unit having a group indicated by the following formula (I):

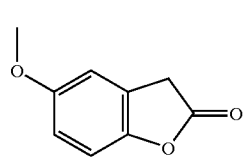

(I)

and (b) a photoacid generator (PAG).

6. The resist composition of claim 5, wherein the photosensitive polymer has the following structure (II):

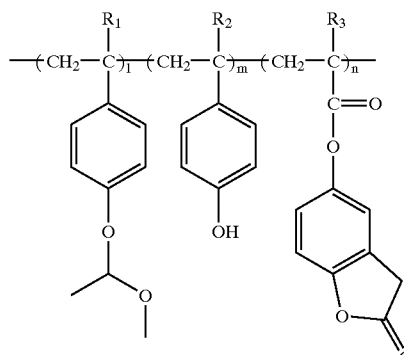

where $R_1$, $R_2$, and $R_3$ are independently a hydrogen atom or an alkyl group, $l/(l+m+n)$=about 0.2–0.5, $m/(l+m+n)$=about 0–0.5, and $n/(l+m+n)$=about 0.4–0.7.

7. The resist composition of claim 5, wherein the photosensitive polymer has a weight average molecular weight of about 1,000 to about 100,000.

8. The resist composition of claim 5, wherein the amount of the PAG is in the range of about 1 to 15% by weight based on the weight of the photosensitive polymer.

9. The resist composition of claim 5, wherein the PAG comprises at least one selected from the group consisting of triarylsulfonium salts, diaryliodonium salts, sulfonates, and mixtures thereof.

10. The resist composition of claim 5 further comprising an organic base.

11. The resist composition of claim 10, wherein the amount of the organic base is in the range of about 0.01 to about 2.0% by weight based on the weight of the photosensitive polymer.

12. The resist composition of claim 10, wherein the organic base comprises a tertiary amine compound or a mixture of at least two tertiary amine compounds.

13. The resist composition of claim 12, wherein the organic base comprises at least one selected from the group consisting of triethylamine, triisobutylamine, triisooctylamine, triisodecylamine, diethanolamine, triethanolamine and mixtures thereof.

14. A resist composition comprising:

(a) a photosensitive polymer including a monomer unit having a group indicated by the following formula (III):

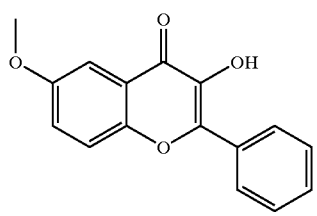

and (b) a photoacid generator (PAG).

15. The resist composition of claim 14, wherein the photosensitive polymer has the following structure (IV):

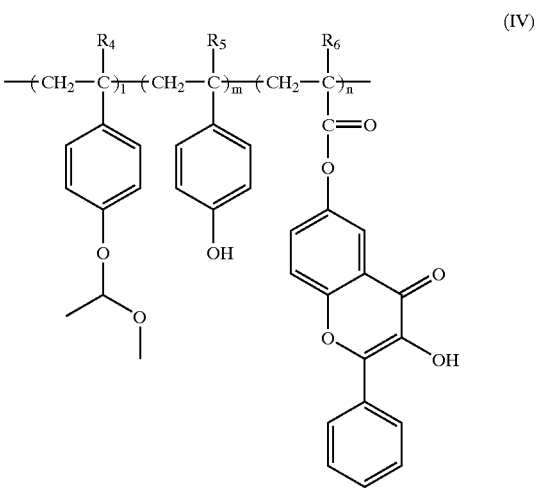

where $R_4$, $R_5$, and $R_6$ are independently a hydrogen atom, an alkyl group, $l/(l+m+n)$=about 0.2–0.5, $m/(l+m+n)$=about 0–0.5, and $n/(l+m+n)$=about 0.4–0.7.

16. The resist composition of claim 14, wherein the photosensitive polymer has a weight average molecular weight of about 1,000 to about 100,000.

17. The resist composition of claim 14, wherein the amount of the PAG is in the range of about 1 to about 15% by weight based on the weight of the photosensitive polymer.

18. The resist composition of claim 14, wherein the PAG comprises at least one selected from the group consisting of triarysulfonium salts, diaryliodonium salts, sulfonates, and mixtures thereof.

19. The resist composition of claim 14 further comprising an organic base.

20. The resist composition of claim 19, wherein the amount of the organic base is in the range of about 0.01 to about 2.0% by weight based on the weight of the photosensitive polymer.

21. The resist composition of claim 19, wherein the organic base comprises a tertiary amine compound or a mixture of at least two tertiary amine compounds.

22. The resist composition of claim 21, wherein the organic base comprises at least one selected from the group consisting of triethylamine, triisobutylamine, triisooctylamine, triisodecylamine, diethanolamine, triethanolamine and mixtures thereof.

* * * * *